United States Patent
Kaszuba et al.

(10) Patent No.: US 7,511,510 B2
(45) Date of Patent: Mar. 31, 2009

(54) NANOSCALE FAULT ISOLATION AND MEASUREMENT SYSTEM

(75) Inventors: Philip V. Kaszuba, Essex Junction, VT (US); Theodore M. Levin, Burlington, VT (US); David P. Vallett, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 388 days.

(21) Appl. No.: 11/164,654

(22) Filed: Nov. 30, 2005

(65) Prior Publication Data

US 2007/0222456 A1 Sep. 27, 2007

(51) Int. Cl.
*H01H 31/02* (2006.01)
*G01R 27/08* (2006.01)
*G01R 31/02* (2006.01)

(52) U.S. Cl. .................. 324/555; 324/715; 324/754
(58) Field of Classification Search ............. 324/715
See application file for complete search history.

(56) References Cited

U.S. PATENT DOCUMENTS

| | | | |
|---|---|---|---|
| 2,672,532 A | 3/1954 | Robinson | |
| 3,316,801 A | 5/1967 | Vogel | |
| 4,480,223 A * | 10/1984 | Aigo | 324/752 |
| 4,613,421 A | 9/1986 | Seshimoto et al. | |
| 5,478,698 A | 12/1995 | Rostoker et al. | |
| 5,679,952 A | 10/1997 | Lutwyche et al. | |
| 6,210,989 B1 | 4/2001 | Kurtz et al. | |
| 6,366,103 B1 * | 4/2002 | Cheng | 324/754 |
| 6,376,833 B2 | 4/2002 | Shimada et al. | |
| 6,635,311 B1 | 10/2003 | Mirkin et al. | |
| 6,702,186 B1 | 3/2004 | Hamann et al. | |
| 6,718,821 B1 | 4/2004 | Houston et al. | |
| 6,771,090 B2 | 8/2004 | Harris et al. | |
| 6,812,460 B1 | 11/2004 | Stallcup, II et al. | |
| 6,833,719 B2 | 12/2004 | Hasegawa et al. | |
| 2002/0076184 A1 * | 6/2002 | Iyoki | 385/123 |
| 2004/0026007 A1 | 2/2004 | Hubert et al. | |

(Continued)

FOREIGN PATENT DOCUMENTS

DE 10107796 A1 7/2002

(Continued)

*Primary Examiner*—Diego Gutierrez
*Assistant Examiner*—Jeff Natalini
(74) *Attorney, Agent, or Firm*—Gibb I.P. Law Firm, LLC; Anthony Canale

(57) ABSTRACT

Disclosed is a fault isolation and measurement system that provides multiple near-field scanning isolation techniques on a common platform. The system incorporates the use of a specialized holder to supply electrical bias to internal circuit structures located within an area of a device or material. The system further uses a multi-probe assembly. Each probe is mounted to a support structure around a common reference point and is a component of a different measurement or fault isolation tool. The assembly moves such that each probe can obtain measurements from the same fixed location on the device or material. The relative positioning of the support structure and/or the holder can be changed in order to obtain measurements from multiple same fixed locations within the area. Additionally, the system uses a processor for providing layered images associated with each signal and for precisely aligning those images with design data in order to characterize, or isolate fault locations within the device or material.

29 Claims, 8 Drawing Sheets

U.S. PATENT DOCUMENTS

| | | |
|---|---|---|
| 2004/0056674 A1* | 3/2004 | Petersen et al. ............. 324/754 |
| 2004/0105380 A1 | 6/2004 | Cho et al. |
| 2004/0113621 A1 | 6/2004 | Naughton |
| 2004/0195202 A1 | 10/2004 | Pechenik |
| 2004/0202226 A1 | 10/2004 | Gianchandani et al. |
| 2005/0140379 A1* | 6/2005 | Furukawa et al. ........... 324/751 |

FOREIGN PATENT DOCUMENTS

| | | |
|---|---|---|
| JP | 2004-219321 | 8/2004 |

* cited by examiner

NANOSCALE FAULT ISOLATION AND MEASUREMENT SYSTEM

BACKGROUND OF THE INVENTION

1. Field of the Invention

The invention generally relates to a system and method for measuring and testing nanoscale devices or materials. More particularly, the present invention relates to a system that allows for near-field scanning with various sensors or energy sources on a common platform to make nanoscale electrical and physical measurements or isolate nanoscale faults.

2. Description of the Related Art

Various electrical and physical measurement techniques can be used to analyze an object having electrical properties (e.g., a chip, a die, an integrated circuit, a device or a material) and to possibly provide information about its operation and/or its condition. For example, various integrated circuit (IC) physical fault isolation tools include laser scanning tools (e.g., Laser Scanning Microscopy (LSM) or Laser Assisted Device Alteration, (LADA)), thermal imaging tools (e.g., Thermal Induced Voltage Alteration (TIVA)), light emission tools (e.g., Light Induced Voltage Alteration (LIVA)), and tools that measure electrical activity in operating integrated circuits (e.g., electron beam probing or Electron Beam Test (EBT), Laser Voltage Probing (LVP), magnetic field or magnetic force microscopy, Photon Emission Microscopy (PEM), Time Resolved Emission (TRE), Picosecond Imaging Circuit Analysis (PICA), etc.). However, the technology associated with these various physical fault isolation tools has generally reached fixed limits in sensitivity and spatial resolution. Specifically, such physical fault isolation tools are rapidly becoming obsolete for one hundred nanometer IC devices or materials and smaller.

Scanning probe systems are also used to make measurements on a variety of devices or materials. However, when an external electrical energy or bias is required such scanning probe systems are limited to use on objects that have connection points that are large enough to be soldered or wire-bonded. They are also limited to use on objects that have connection points that are far enough from the area of interest so as not to physically obstruct a probe that must be scanned very near the surface of the object. Further, such scanning probe systems are limited to acquisition with one such scanned probe at a time, or on one separate instrument at a time, such that data acquired with a first probe or instrument is not spatially registered and aligned with data acquired from subsequent probes or instruments, such that features contained within a signal from one sensor cannot be exactly correlated with features contained within signals from other sensors. Thus, there is a need for an improved nanoscale fault isolation and measurement system having a number of scanning probes capable of different electrical and physical measurements. The improved system should be capable of being electrically connected to nanoscale circuit nodes and have high sensitivity and nanoscale spatial resolution. Lastly, the improved system should allow for a variety of different measurements to be taken from a common platform so that data acquired by any probe is automatically exactly spatially registered and aligned with data from any other probe.

SUMMARY OF THE INVENTION

In view of the foregoing, embodiments of the invention provide a nanoscale fault isolation and measurement system and an associated method that allow data to be obtained from a predetermined area of an object having electrical properties (e.g., a chip, a die, an integrated circuit, a device, a material, etc.) using a plurality of near-field scanning physical fault isolation and measurement techniques on a common platform. The system can comprise a holder that is adapted to supply an electrical bias to the predetermined area and a multi-probe assembly that is adapted to evaluate the object using a plurality of implements that sense a parameter and/or apply an energy source at a same fixed location within the predetermined area. The object holder can be configured to hold the object such that the predetermined area of the object is exposed. The holder may further be configured so that it may easily be electrically connected to different conductive structures in the predetermined area so that an electrical bias supplied by an electrical stimulus through the holder may be applied to the predetermined area. For example, the holder can comprise a rigid insulating planar section with a raised edge. The planar section can be configured to hold the object such that a side of the object abuts the raised edge and such that a predetermined area of the top surface of the object remains exposed. The raised edge can have a horizontal groove that is configured to receive the object. The raised edge can also have a tapered upper surface that extends downward toward the top surface of the object when the object is in the holder.

A plurality of first conductors (e.g., pins connecting to leads) can extend vertically through the raised edge. A plurality of second conductors can be connected to the first conductors. The second conductors can extend from the first conductors towards the top surface of the object along the tapered upper surface of the raised edge. The second conductors can each be electrically connected to different conductive structures (e.g., different internal circuit nodes in the device or material) in the predetermined area by discrete locally deposited third conductors (e.g., focused ion beam deposited conductors, laser deposited conductors, conductive inks, etc.) so that an electrical stimulus conducted through the holder can be used to electrically bias the predetermined area. For example, an electrical stimulus supplied by a power source to a lead on the holder can be conducted through a first conductor, a second conductor and a third conductor to a first node in the predetermined area. The third conductor could be deposited using one of the scanned probes of the instrument capable of applying a conductive ink on a surface. The current can then be transmitted through a second node in the predetermined area back through the holder (e.g., through another third conductor, another second conductor and another first conductor). Simultaneously, the predetermined area of the object can be scanned by a probe with limited obstruction by the third conductors or the holder, if the third conductors are deposited on nodes or structures (e.g., gates, source/drain regions, etc.) that are located close to the raised edge.

Furthermore, the multi-probe assembly can comprise a common platform for multiple physical fault isolation and measurement techniques which can be used to image the predetermined area within the object. Specifically, the multi-probe assembly can have a support structure (e.g., a shaft, a turret, etc.), a common reference point (e.g., the center of the support structure) and multiple arms that are mounted to and extend (e.g., radially) from the support structure. Each arm can have a probe comprising one or more implements (e.g., different sensors or energy sources for different types of fault isolation or other-type tools) that are adapted to evaluate the object. More specifically, each implement can be adapted to evaluate the object by either sensing a parameter (e.g., light, electric fields, magnetic fields, temperature, capacitance, topography, etc.) or by applying a different energy sources (e.g., heat, light, electric fields, magnetic fields, etc.). For example, each implement can comprise one or more photonic sensors or energy sources, magnetic sensors or energy sources, electric field sensors or energy sources, topographical sensors, thermal sensors or energy sources, capacitance sensors or energy sources, etc. Each of the probes should be located at a known location from the common reference point such that when either the support structure is moved (e.g., rotated) or the arms are moved in relation to the support structure (e.g., rotated about the support structure), depending upon the embodiment, each of the different implements of each probe can evaluate the object at a same fixed location within the predetermined area. Additionally, the multi-probe assembly can be adapted to scan the predetermined area such that the different implements can evaluate the object from multiple same fixed locations within the predetermined area. In this manner, the respective signals acquired or imparted by the different implements (e.g., sensors or energy sources) can be spatially registered and thus aligned with each other.

The system can also comprise a first processor and a second processor. The first processor (i.e., a signal processor) can be adapted to receive signals from the multiple probes as well as data regarding the electrical stimulus (e.g., voltage, etc.) and to process the signals as necessary. The specific signal processing required may vary depending upon the type of implement being used and the type of physical fault isolation and measurement tools being used. Once the signals are processed by the signal processor, they are forwarded to the second processor for further processing.

The second processor can be adapted to analyze the data received from the first processor and particularly, to form a plurality of images of the predetermined area based on the signals from each of the probes. For example, for each of the different properties sensed or applied by each of the different sensors or energy sources, a signal image (e.g., a nanometer-scale high-resolution signal image) of the predetermined area can be formed by the second processor.

The second processor can also be adapted to allow a user to display and layer images, representing the various acquired signals, on a display screen. Since the signals are obtained from the same fixed locations within the predetermined area, alignment of the layered images is not required. By displaying and overlaying the images on the display screen, the user can visually observe known points in each of the aligned images and then use the aligned images to identify previously unknown locations of features within the images (e.g., points of interest, faults, etc.). Additionally, the second processor can be adapted to precisely correlate these signal images with externally supplied data (i.e., design data) indicating the intended construction of the object in order to isolate faults or make measurements within the predetermined area. For example, the user can select known points in one of the signal images to manually align with known points in an externally supplied design data image, such that features in the remaining signal images can be correlated with locations in the design data.

An embodiment of the method of obtaining nanometer scale data from a predetermined area of a object having electrical properties (e.g., a chip, a die, an integrated circuit, a device, a material, etc.) by using a plurality of near-field scanning physical fault isolation and measurement techniques on a common platform comprises first providing a holder (e.g., a holder as described in detail above). The object is secured (e.g., by adhesive or clamping) to the planar section of the holder such that the predetermined area of the object is exposed and such that a side of the object abuts the raised edge. Once the object is held by the holder, discrete third conductors are locally deposited such that the second conductors are electrically connected to different conductive structures (e.g., internal circuit nodes, device, materials, etc.) within the predetermined area. Then, an electrical stimulus, supplied by a power source, is applied to the holder and conducted into the object in order to electrically bias the predetermined area.

As the predetermined area is electrically biased, a multi-probe assembly comprising a common platform for multiple physical fault isolation and measurement techniques, as described above, can be used to scan the predetermined area and to evaluate the object by either sensing different parameters (e.g., light, electrical fields, magnetic fields, topography, heat, capacitance, etc.) or by applying different energy sources (e.g., light, electrical fields, magnetic fields, heat, etc.) at one or more same fixed locations within the predetermined area. For example, each probe on each arm of the assembly can comprise an implement adapted to evaluate the object by either sensing a parameter or applying an energy source. Each implement can be positioned at a fixed location within the predetermined area and can evaluate the object at that fixed location. Then, the assembly (e.g., either the support structure itself or the arms about the support structure) can be periodically rotated so that each of the different implements can evaluate the object from the same fixed location. After completing a cycle at one fixed location, the multi-probe assembly can scan the predetermined area (e.g., by changing the relative positioning of the multi-probe assembly and the holder) so that each of the implements can again evaluate the object at another same fixed location.

As each of the implements evaluates the object (i.e., as each of the different properties are sensed or applied by each of the different sensors or energy sources, respectively), signals are transmitted from the probes on the multi-probe assembly or from the sensor to a first processor (i.e., a signal processor) and onto a second processor (e.g., a computer) for analysis. Processing by the signal processor will vary depending upon the type of fault-isolation tool being used. The second processor then processes the digital signals in order to provide a plurality of images based on signals received from each implement. For example, each signal image (e.g., nanometer-scale high-resolution signal image) can represent a different property sensed or applied by each of the different implements and can correspond to all or part of the predetermined area. Since the various signals are obtained from the same fixed locations, the signal images can be arranged as aligned layers by the second processor and can be displayed on a display screen. The layered signal images can then be analyzed in order to detect and isolate faults or make measurements. Additionally, by displaying the aligned signal images on the display screen a user can further overlay and visually align known common alignment points in externally supplied design data with the known common alignment points in the signal images in order correlate previously unknown locations of features in the signal images (e.g., faults) with known features in the design data.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the invention includes all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

Figure 1:
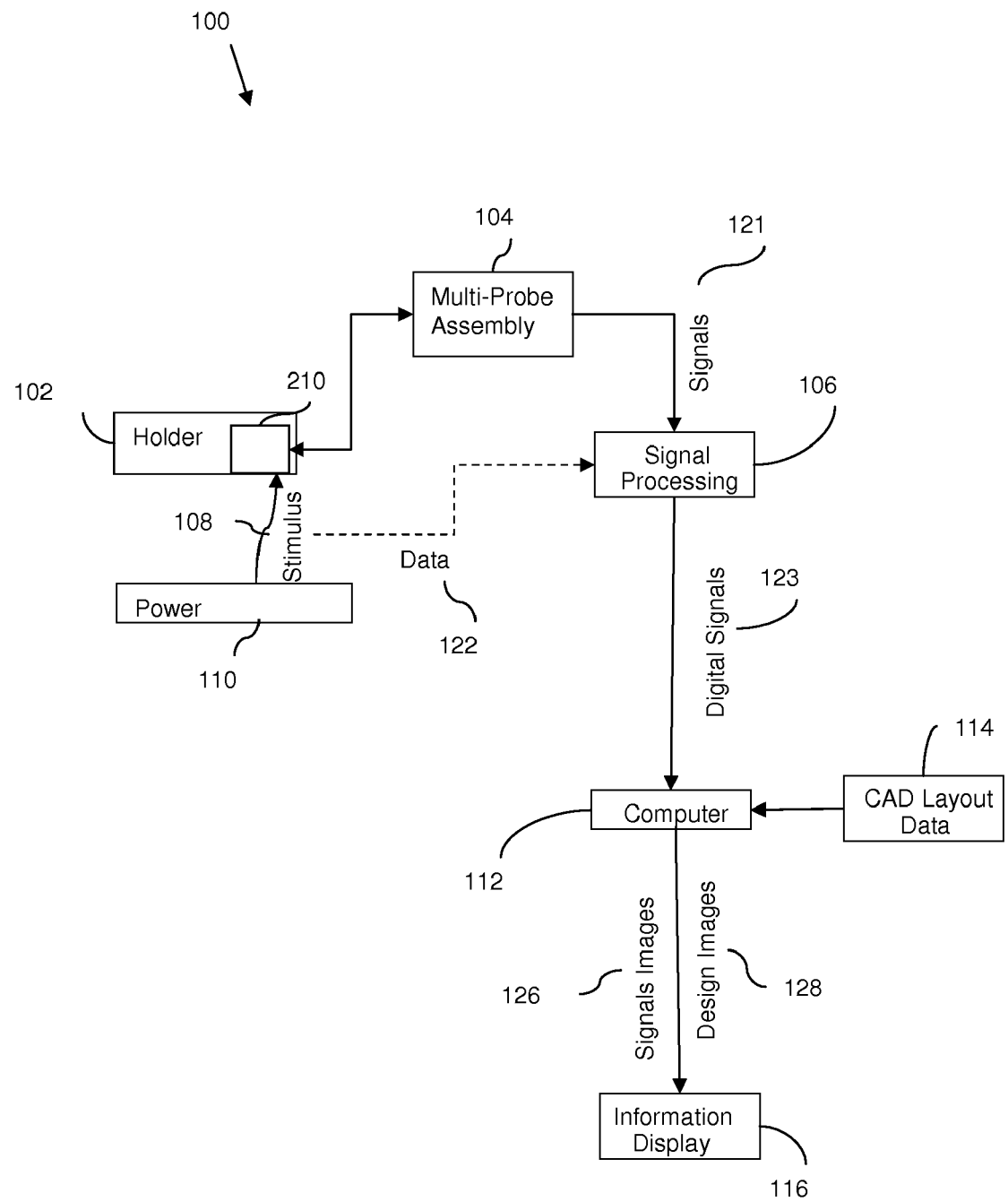
FIG. 1 illustrates a schematic diagram of an embodiment of a fault isolation system of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the invention.

As mentioned above, currently available physical fault isolation tools are rapidly becoming obsolete for one hundred nanometer device or materials and smaller because these tools are unable to achieve the required sensitivity and spatial resolution. Recent advancements in physical fault isolation and measurement technology have attempted to improve both sensitivity and resolution by using the above-described measurement techniques (e.g., scanning probe microscopy and scanning magnetic microscopy) in the near-field (i.e., by gathering signals nanometers above the circuitry of interest). However, these advancements only provide partial and limited solutions. For example, scanning probe microscopes lack the ability to measure so-called 'internal circuits' and individual device or materials that require electrical stimulus and cannot be wire-bonded, soldered, or otherwise connected through relatively large pads. Scanning probe microscopes also lack the ability to scan large areas as is necessary in analyzing whole device, materials, or circuits. Near-field scanning magnetic microscopes, for example, lack sufficient registration capability to correlate magnetic signals to topographical image. Both of these solutions lack integration of device or material design data that aligns precisely to the actual sample through a high resolution topographical image. Both of these solutions also lack a near-field optical scanning ability that allows for photon emission measurement, or photon or thermal scanning microscopy. Lastly, these solutions are contained on separate platforms requiring various electrical biasing arrangements, significant sample handling between instruments, and most importantly, no capability for registration or alignment of the separately acquired measurements.

Therefore, referring to FIG. 1, disclosed herein is a system 100 and method to acquire high resolution and high sensitivity signals from electrically energized objects such as nanoscale devices or materials that are exactly aligned and registered with one another such that features within the signals can be processed and spatially correlated with known features within the topography or design data of the object. The system 100 and method can be used for characterization, diagnostic testing, fault isolation, measurement, or analysis. The system 100 and method can be applied to objects such as electronic devices or materials (e.g., integrated circuits, chips, dies, nanoelectronic devices or materials, etc.) as well as any other object having electrical properties such that they produce or respond to signals that can be measured or applied using a near-field scanning probe (e.g., nanomaterials, nanocrystals, self-assembled materials, quantum dots, nanowires, molecular devices or materials, tunnel junctions, Josephson junctions, etc.).

More specifically, disclosed herein is a nanoscale physical fault isolation and measurement system 100 that provides multiple near-field scanning physical fault isolation and measurement techniques on a common platform. The nanoscale physical fault isolation and measurement system 100 incorporates the use of a specialized carrier 102 (i.e., a holder) to hold an object 210 having electrical properties (e.g., a chip, a die, an integrated circuit, an electronic device or material, nanomaterials, nanocrystals, etc., as described above) and to supply electrical bias to different conductive structures (e.g., circuit nodes, devices, materials, etc.) located within a predetermined area of the object 210.

The system 100 further incorporates the use of a multi-probe assembly 104 having a support structure (e.g., a shaft, turret, etc.), a common reference point (e.g., the center of the support structure) and multiple arms mounted on the support structure about the common reference point. Each arm has a probe comprising an implement that is for use in conjunction with different physical fault isolation and measurement techniques. The support structure and/or the holder are configured such that their relative positioning can be changed so that the probe may scan the predetermined area of the object and obtain measurements from various fixed locations within the predetermined area. The support structure and/or the mount for the arms are also configured to rotate such that each probe can obtain measurements from the same multiple fixed locations. Additionally, the system incorporates the use of a signal processor 106 and another processor 112 for analyzing data obtained using each probe and to precisely correlate the analyzed data to design CAD layouts 114 so that nanometer-scale high resolution images 126 can be formed and displayed 116.

More particularly, embodiments of the invention provide a nanoscale fault isolation and measurement system 100 and an associated method that allow data to be obtained from a predetermined area of an object 210 by using a plurality of near-field scanning physical fault isolation and measurement techniques on a common platform. The system 100 can comprise a holder 102 that is adapted to supply an electrical bias to the predetermined area of the object 210 and a multi-probe assembly that is adapted to evaluate the object, and particularly, the predetermined area by sensing different parameters or applying different energy sources to fixed locations within the predetermined area. The holder 102 can be configured to hold the object 210 such that the predetermined area is exposed. The holder 102 may also be configured so that it may easily be electrically connected to multiple different conductive structures within the predetermined area so that an electrical bias supplied by an electrical stimulus through the holder 102 may be applied to the predetermined area.

Figure 2:
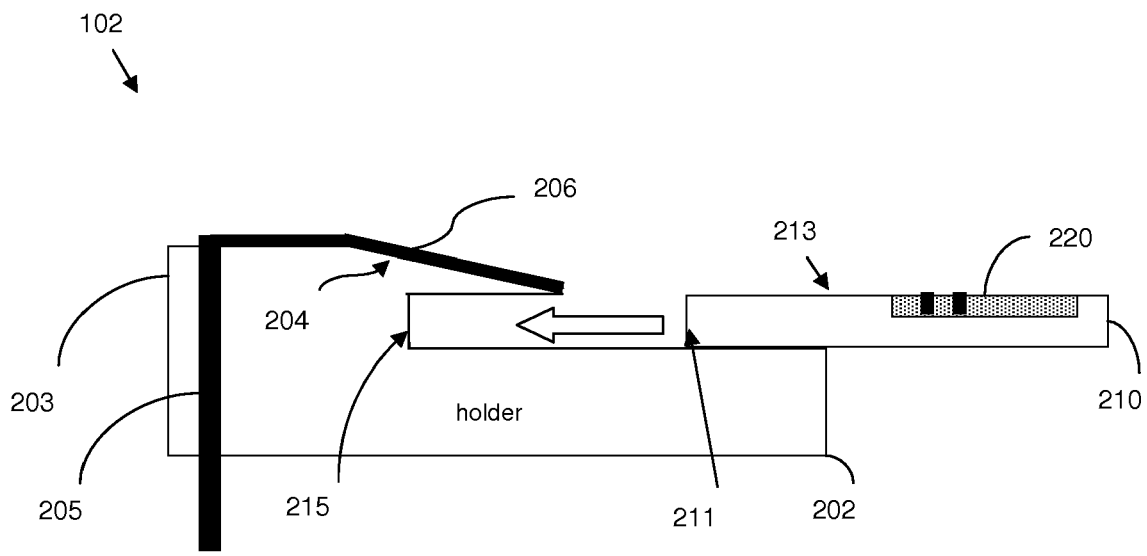
FIGS. 2-3 illustrate schematic cross-sectional diagrams of an exemplary device or material holder of the system of FIG. 1.
Figure 3:
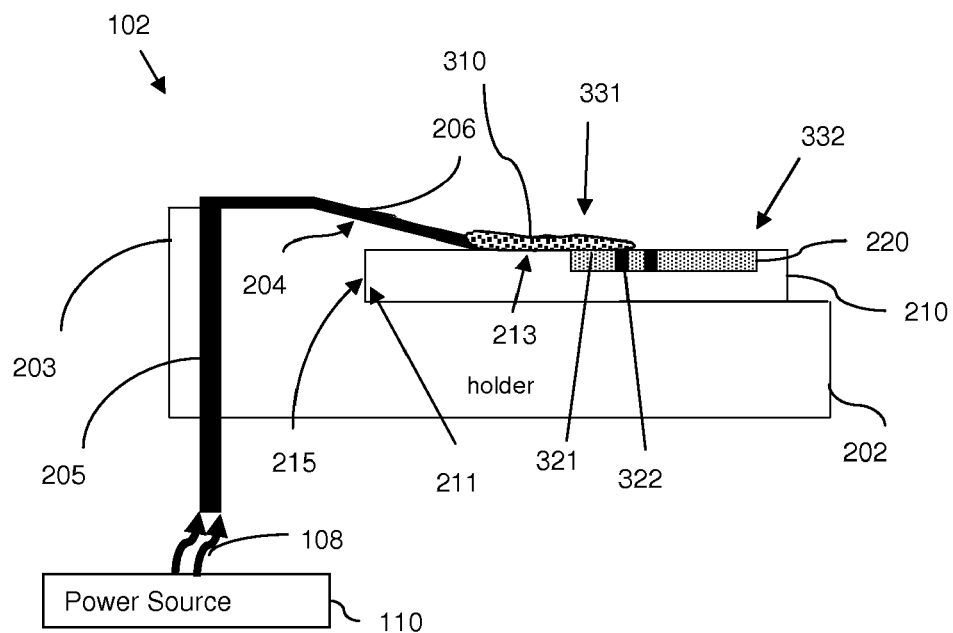

FIGS. 2 and 3 illustrate an exemplary holder 102 before and after, respectively, an object 210 is secured into the holder 102. The holder 102 can comprise a planar section 202 having a raised edge 203. The holder 102 can be formed of a rigid insulating material such as that used to form printed circuit or wiring boards. The planar section 202 can be configured to hold the object 210 such that a side 211 of the object 210 can abut the raised edge 203 and such that a predetermined area 220 of a top surface 213 of the object 210 can remain exposed. The object 210 can be secured into position within the holder 102, e.g., by adhesive or by clamping. The raised edge 203 can comprise a horizontal groove 215 that is located immediately adjacent to the planar section 202 and is configured to receive the object 210 (as discussed above). For example, the groove 215 may form a pocket that receives and secures the object 210 in position. The raised edge 203 can also comprise a tapered upper surface 204 that extends downward toward the top surface 213 of the object 210 when the object 210 is secured in the holder 102 (as illustrated in FIG. 3).

Figure 4:
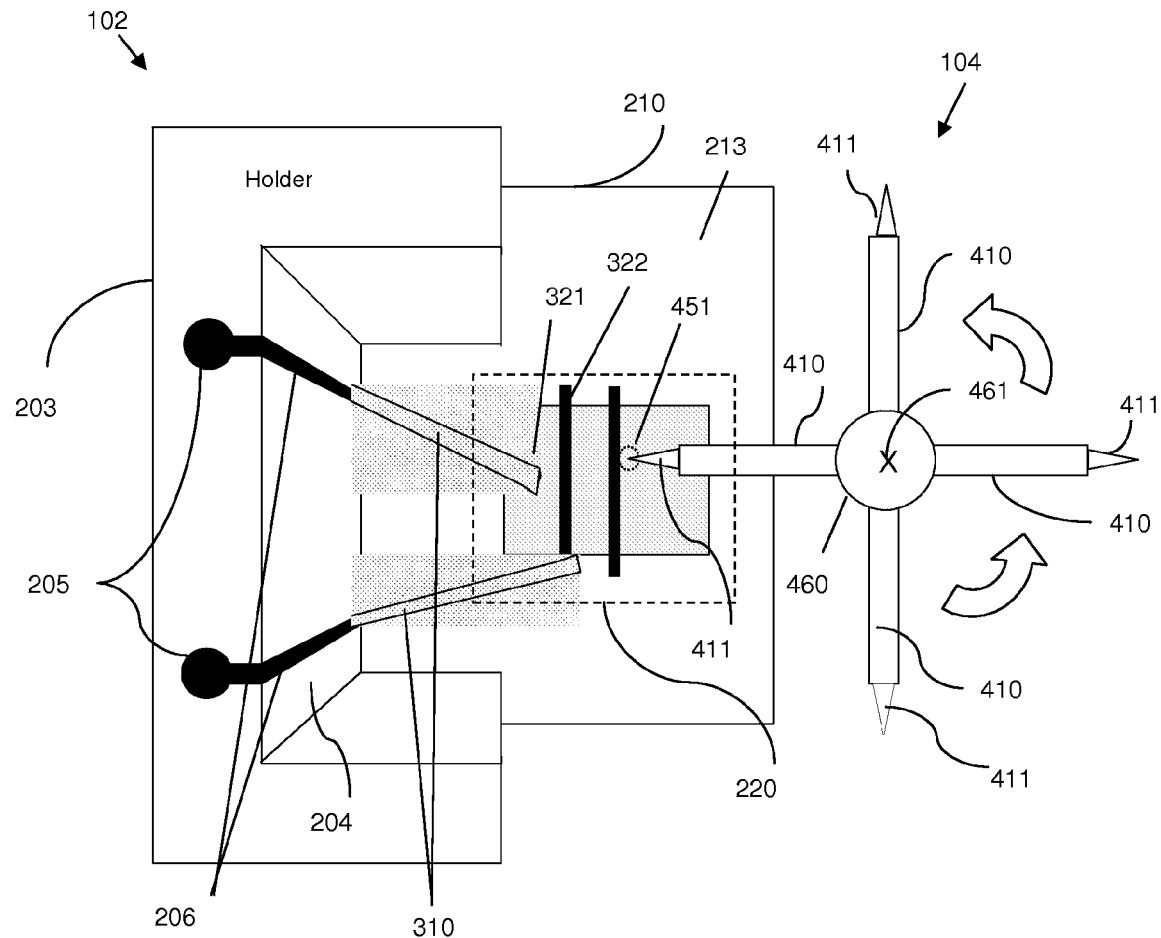
FIG. 4 illustrates a schematic top view diagram of an exemplary device or material holder relative to a multi-probe assembly of the system of FIG. 1.

A plurality of first conductors 205 (e.g., pins 205 connecting to leads) can extend vertically through the raised edge 203. A plurality of second conductors 206 can be connected to the first conductors 205. The second conductors 206 can extend from the first conductors 205 towards the top surface 213 of the object 210 along the tapered upper surface 204 of the raised edge 203. The second conductors 206 can each be electrically connected to two or more different conductive structures 322, 321, such as different internal circuit nodes or different internal circuit device or materials, in the predetermined area by discrete locally deposited third conductors 310. For example, as illustrated in FIG. 4, one second conductor 206 may be electrically connected by a third conductor 310 to a gate 322 within the predetermined area 220 and another second conductor 206 may be connected by another third conductor 310 to a drain region 321 within the predetermined area. The discrete third conductors 310 may be locally deposited, for example, by focused ion beam or laser deposition, or by conductive ink application, so that an electrical stimulus 108 conducted through the holder 102 can be used to electrically bias the predetermined area 220.

For example, an electrical stimulus 108 supplied by a power source 110 to a lead on the holder 102 can be conducted through a first conductor 205, a second conductor 206 and a third conductor 310 to a gate 322 in the predetermined area 220. The current 108 can then be transmitted through the predetermined area 220 to a drain region 321 back through the holder 102 (e.g., through another third conductor 310, another second conductor 206 and another first conductor 205) and to ground. Simultaneously, the predetermined area 220 of the object 210 can be scanned by using a multi-probe assembly 104. Specifically, a probe of the assembly, described below, may scan the predetermined area 220 with limited obstruction by the third conductors 310 if the third conductors 310 are deposited on structures 321 and 322 (e.g., gates, source/drain regions, etc.) that are located closer to a first end 331 of the predetermined area 220 nearest the raised edge 203 rather than to structures located closer to the second end 332 of the predetermined area opposite the raised edge 203, as illustrated in FIG. 3.

Figure 5A:
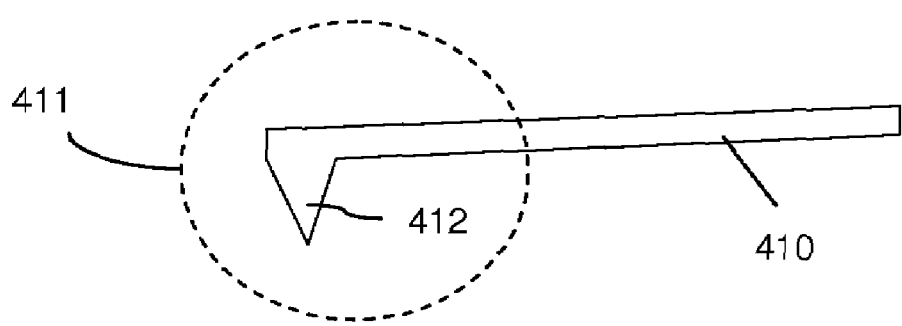
FIGS. 5a-5b illustrate schematic side view diagrams of exemplary probes of a multi-probe assembly of the system of FIG. 1.
Figure 5B:
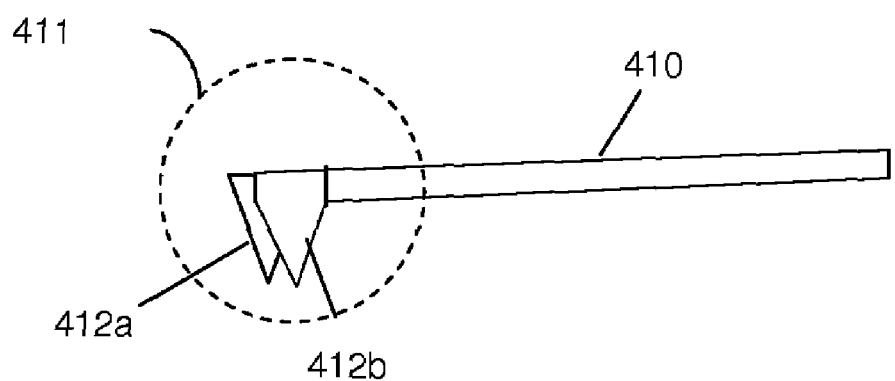

Referring to FIG. 4, the multi-probe assembly 104 can comprise a common platform for multiple physical fault isolation and measurement techniques which can be used to image the predetermined area 220 within the object 210. Specifically, the multi-probe assembly 104 can comprise a support structure 460, such as a shaft, a turret, etc., a common reference point 461, such as the center of the support structure 460, and multiple arms 410 that are mounted to and extend (e.g., radially) from the support structure 460. Each arm 410 can have a probe 411 comprising a different implement 412 (as illustrated in FIG. 5a) or multiple different implements 412a-b (as illustrated in FIG. 5b) that for use in conjunction with different types of fault isolation or other-types of tools (e.g., conductivity or topography mapping). Thus, the different implements 412 of each probe 411 can be adapted to evaluate the object by sensing a different parameter (e.g., light, electric fields, magnetic fields, temperature, capacitance, topography, etc.) or by applying one or more different energy sources (e.g., light, electric fields, magnetic fields, temperature, etc.) to the object. For example, each implement 412 can comprise one or more photonic sensors or energy sources, magnetic sensors or energy sources, electric field sensors or energy sources, topographical sensors, thermal sensors or energy sources, capacitance sensors, etc. More specifically, each arm 410 mounted on the support structure 460 can comprise thermal probes for scanning thermal microscopy (SThM), topographical probes for atomic force microscopy (AFM), fiber optic light probes for LIVA, magnetoresistive (MR) or magnetic force (MFM) magnetic probes, capacitance probes, etc. Each of the probes 411 should be located at a known location from the common reference point 461 such that when either the support structure 460 itself is rotated or the arms 410 are rotated about the support structure 460 (e.g., on a rotating mount), each of the different implements 412 can evaluate the object (e.g., by sensing a given parameter or applying an given energy source) from a same fixed location 451 within the predetermined area 220.

Figure 6:
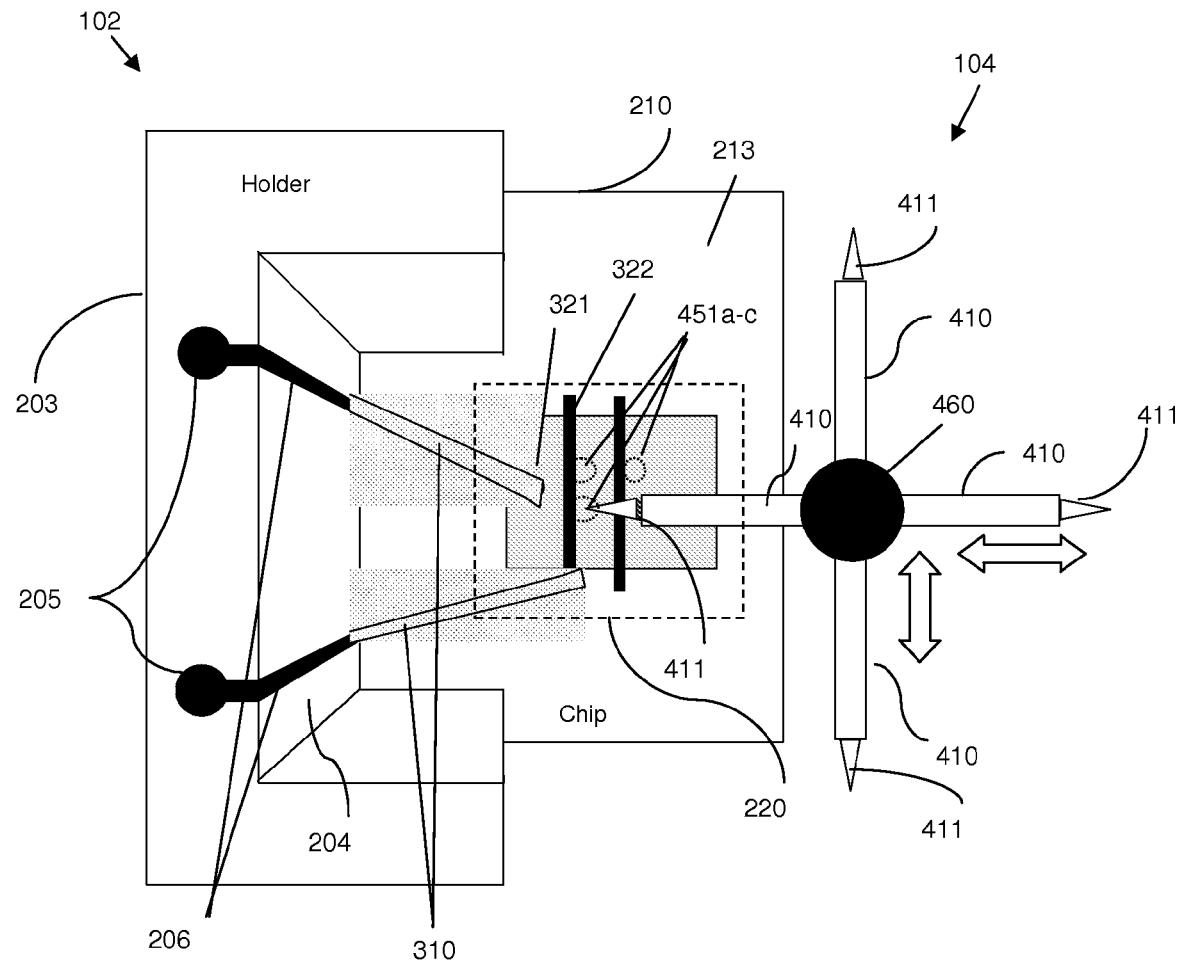
FIG. 6 illustrates a schematic top view diagram of an exemplary device or material holder relative to a multi-probe assembly of the system of FIG. 1.

Additionally, referring to FIG. 6, the multi-probe assembly 104 can be adapted to scan the predetermined area 220 such that the different implements 412 can evaluate the object, as described above, from multiple same fixed locations 451 a-c within the predetermined area 220. For example, the support structure 460 (and, thus, the common reference point 461) may be moved to different locations relative to the holder 102 within the same horizontal plane (e.g., back and forth, side to side, diagonally, etc.) such that a probe 411 on an arm 410 is moved to a different fixed location (e.g., from 451a to 451b) within the predetermined area 220. At each new fixed location, the support structure 460 or the arms 410, as described above, can be rotated to obtain data from each implement 412 (e.g., sensor or energy source).

Referring again to FIG. 1, in addition to the holder 102 and the multi-probe assembly 104, the system 100 can also comprise a first processor 106 and a second processor 112. The first processor 106 (i.e., a signal processor) is adapted to receive signals 121 from the different implements (e.g., sensors, energy sources, etc.) of probes 412 on the multi-probe assembly 104 as well as data 122 regarding the electrical stimulus 108 (e.g., voltage, etc.) applied to the object 210 and to process the signals 121 as necessary. Those skilled in the art will recognize that the specific signal processing required will vary depending upon the type of implements used in the multi-probe assembly 104 and the physical fault isolation and measurement technique being used. For example, the first processor 106 may comprise an amplifier to amplify a sensed analog signal (e.g., from a fiber optic sensor or from the device or material when excited with an applied property such as light) and an analog-to-digital converter to convert the amplified signal into the digital domain. Once the signals are processed and converted into a digital signal 123 (i.e., digital data) by the signal processor 106, they are forwarded to the second processor 112 (e.g., a computer processing unit) and further processed.

Figure 7A:
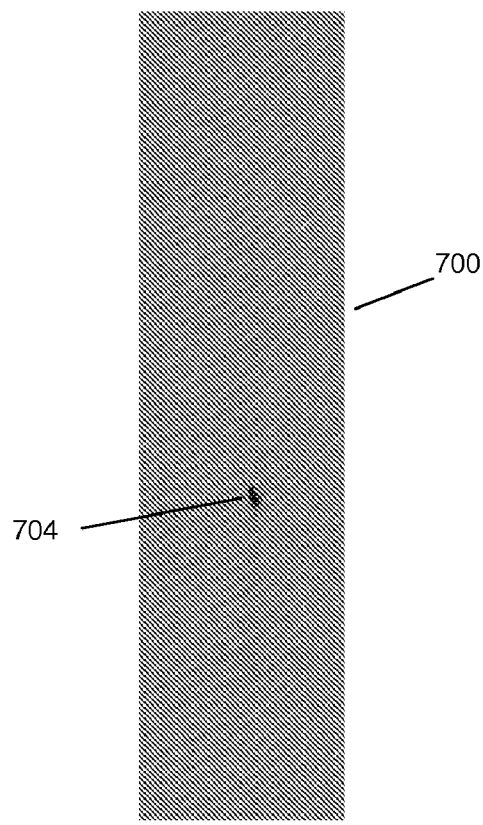
FIGS. 7a and 7b illustrate exemplary signal images obtained with the system of FIG. 1.
Figure 7B:
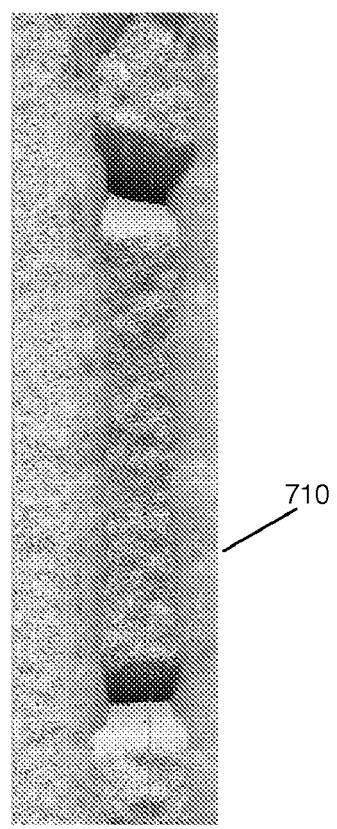
Figure 7C:
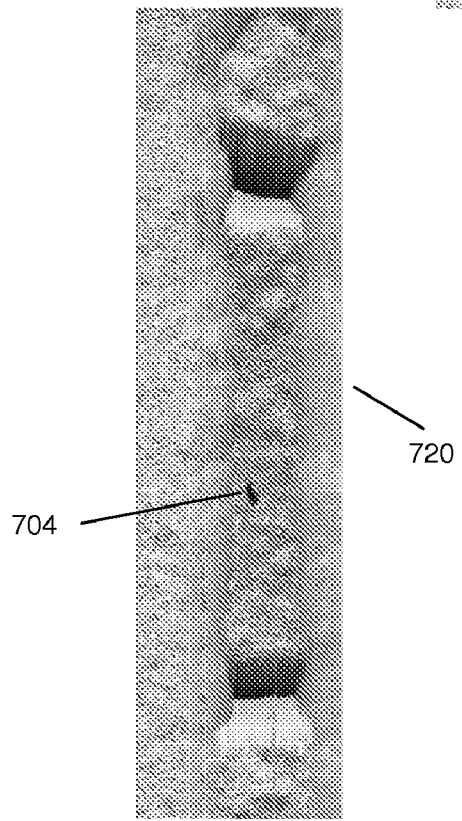
FIG. 7c illustrates an exemplary overlay of the signal images of FIGS. 7a-b.

The second processor 112 can be adapted to analyze the digital signal data 123 received from the first processor 106 and particularly, to form a plurality of signal images 126 of the predetermined area 220 based on the signals 121. The signal images 126 of the predetermined area can comprise the entire predetermined area or a portion thereof. Thus, for each of the different properties sensed or for each energy source applied, a signal image 126 (e.g., a nanometer-scale high-resolution signal image) of the predetermined area can be formed by the second processor 112. For example, FIGS. 7a and 7b illustrate a tunneling current signal image 700 and a topography signal image 710, respectively, taken from the same fixed locations within the predetermined area 220. The second processor 112 can further be adapted to allow a user to display and overlay the various signal images (e.g., images 700 and 710) on a display screen 116, as illustrated by overlaid image 720 of FIG. 7c. Since the signals 121 are obtained from the same fixed locations within the predetermined area 220, visual alignment of the layered images 700 and 710 is not required. By displaying and overlaying the images 700 and 710 on the display screen 116, the user can visually observe known points 701-703 in each of the layered aligned images 700, 710 and then based on the known points 701-703 analyze the layered images to identify previously unknown fault locations 704 or the locations of other points of interest and to make measurements within the predetermined area.

Figure 8A:
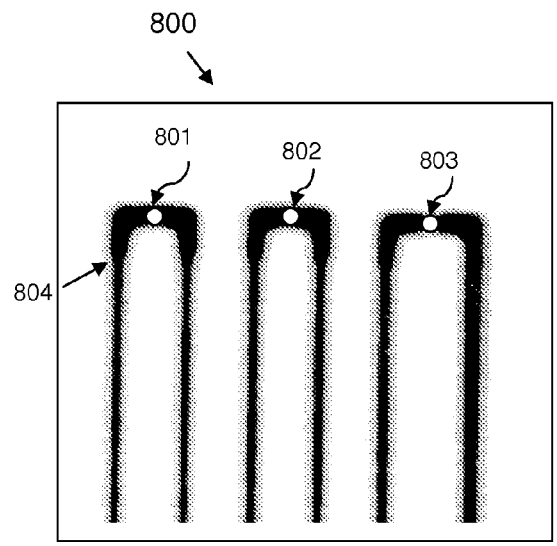
FIG. 8a illustrates an exemplary signal image obtained with the system of FIG. 1.
Figure 8B:
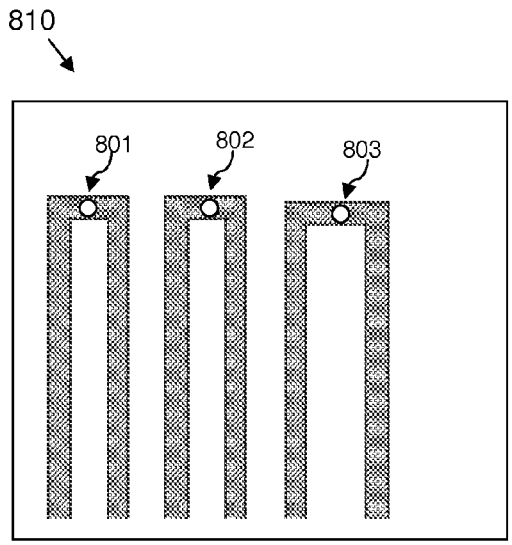
FIG. 8b illustrates an exemplary design image.
Figure 8C:
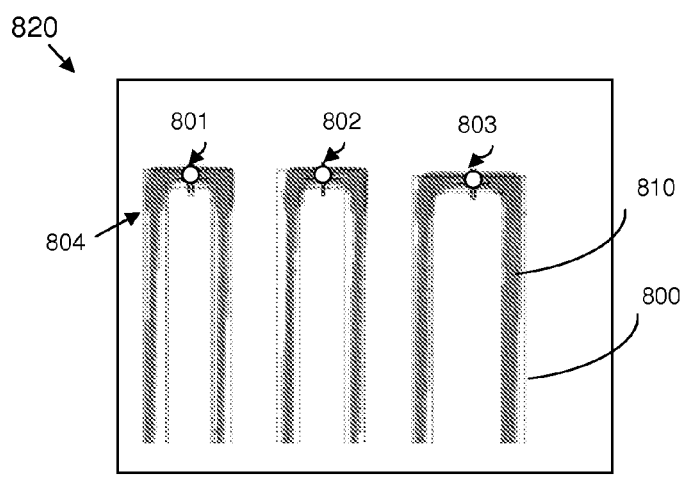
FIG. 8c illustrates an exemplary overlay of the signal image of FIG. 8a and the design image of FIG. 8b.

The second processor 112 can further be adapted to precisely correlate either layered or individual signal images 126 with design images 128 from the externally supplied data 114 (i.e., design data) that indicate the intended construction of the object (e.g., the chip, the die, the integrated circuit, the device, the material, etc.) and, particularly, the intended construction of the predetermined area of the object, in order to isolate faults or make measurements within the predetermined area. For example, as illustrated in FIGS. 8a-8c, the user can select known points 801-803 in a signal image 800, such as a capacitance image, as illustrated in FIG. 8, and manually align those known points 801-803 with the same known points 801-803 in the externally supplied design data image 810 (as illustrated in FIG. 8b) to form an overlaid image 820 (as illustrated in FIG. 8c). Based on these known locations 801-803, this overlaid image 820 can be analyzed to identify and locate additional features 804 (e.g., faults or other points of interest) in the signal image 800 and to make measurements within the predetermined area.

Figure 9:
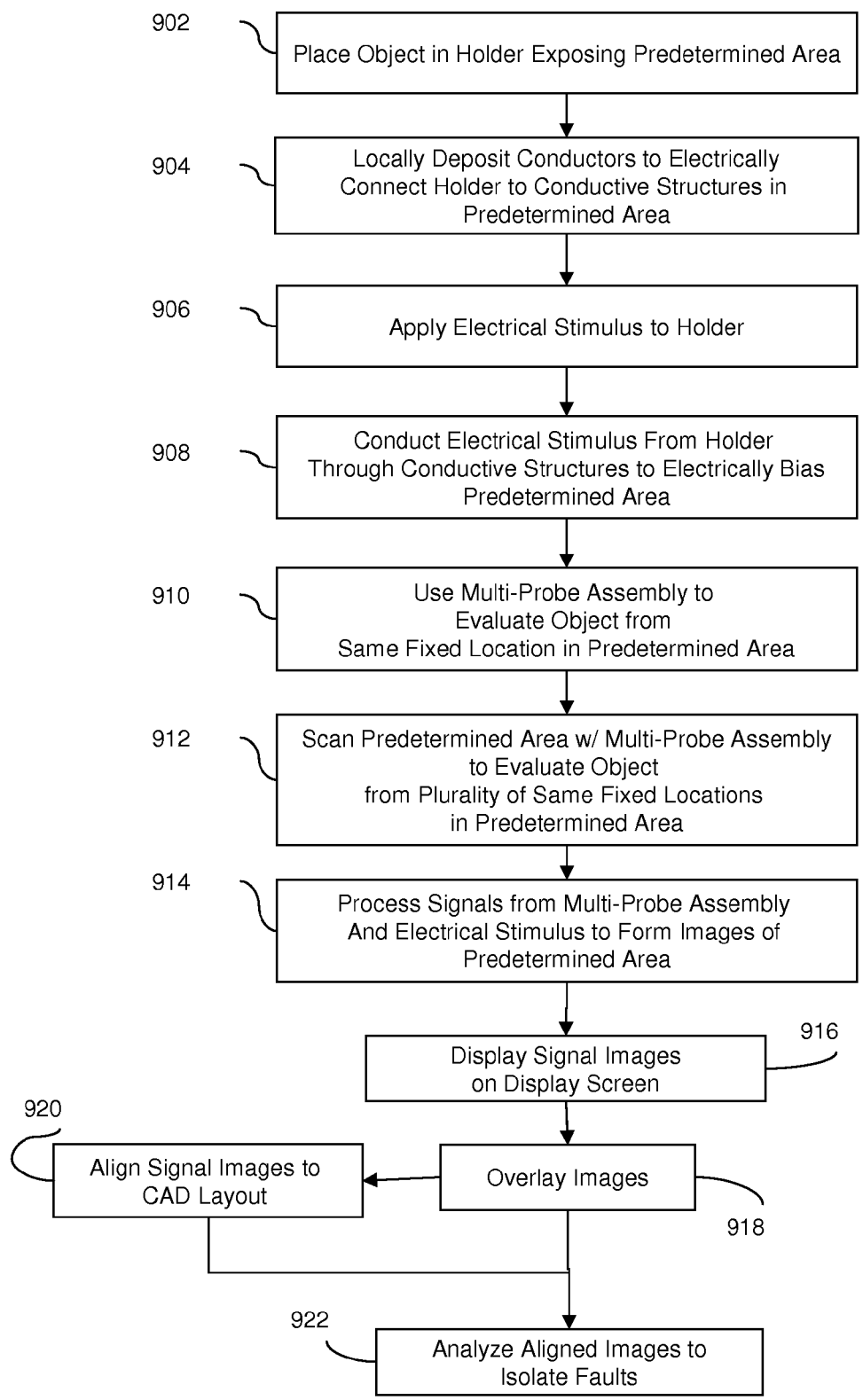
FIG. 9 is a schematic flow diagram illustrating an embodiment of a method of the invention.

Referring to FIG. 9 in combination with FIGS. 1-8c, an embodiment of the method of obtaining nanometer scale data from a predetermined area of an object 210 having electrical properties, as discussed in detail above, by using a plurality of near-field scanning physical fault isolation and measurement techniques on a common platform comprises first providing a holder 102 that can hold the object 210 such that a predetermined area 220 of the object is exposed (902, see FIGS. 2-3). Additionally, the holder 102 should be configured for easy electrical connection to multiple different conductive structures 321-322 in the predetermined area 220 so that an electrical bias supplied by an electrical stimulus 108 from a power source 110 through the holder 102 may be applied to the predetermined area 220 (e.g., see detailed discussion of holder 102 above).

The object 210 is secured (e.g., by adhesive or clamp) to the planar section 202 of the holder 102 such that the predetermined area 220 of the object 210 is exposed and such that a side 211 of the object 210 abuts the raised edge 203. Once the object 210 is held by the holder 102, multiple discrete third conductors 310 are locally deposited onto the holder 102 and the object 210 such that the second conductors 206 of the holder are electrically connected to different conductive structures 322, 321 (e.g., internal circuit nodes or devices or materials) within the predetermined area (904). The discrete third conductors 310 may be locally deposited, for example, by focused ion beam deposition, laser deposition, or conductive ink application, so that an electrical stimulus 108 conducted through the holder 102 can be used to electrically bias the predetermined area 220

The electrical stimulus 108 is supplied by a power source 110 to the holder 102. For example, the electrical stimulus 108 may be applied to a lead connected to a first conductor 205 in the raised edge 203 of the holder 102 (906). The electrical stimulus 108 can be conducted from the holder 102 through the different conductive structures 322, 321 in the object in order to electrically bias the predetermined area 220 (908).

As the predetermined area is electrically biased (at process 908), a multi-probe assembly 104 comprising a common platform for multiple physical fault isolation and measurement techniques, as described in detail above, can be used to scan the predetermined area and to evaluate the object by either sensing different parameters (e.g., light, electrical fields, magnetic fields, topography, heat, capacitance, etc.) or by applying different energy sources (e.g., light, electrical fields, magnetic fields, heat, etc.) at one or more same fixed locations within the predetermined area (910-912). For example, (as illustrated in FIGS. 4-5) one of the probes 411 of the assembly can be positioned at a fixed location (e.g., fixed location 451a) within the predetermined area 220. An implement 412 (e.g., a sensor or an energy source as described in detail above) of the probe 411 can evaluate the object at that fixed location 451a. Then, either the support structure 460 or the arms 410 of the assembly can be rotated so that the different implement(s) 412 on an adjacent arm can evaluate the object at the same fixed location 451a within the predetermined area 220, and so on (910). After completing a cycle (at process 910) at one fixed location 451a, the multi-probe assembly 104 can scan the predetermined area 220 (e.g., by changing the relative positioning in the same horizontal plane of the multi-probe assembly 104 and the holder 102) so that each of the different implements 412 can again be used to evaluate the object at another same fixed location 451b within the predetermined area 220, and so on (912).

As each of the implements 412 evaluate the object, signals 121 are transmitted from the multi-probe assembly 104 to a first processor 106 (i.e., a signal processor) and onto a second processor 112 (e.g., a computer processing unit) for analysis. Processing by the signal processor 106 will vary depending upon the type of fault-isolation tool being used and may include converting an analog signal into a digital signal. The second processor 112 then processes the digital signals 123 in order to provide, for each of the different signals 121 an image (e.g., nanometer-scale high-resolution image) of all or part of the predetermined area (914).

The signal images can be displayed and overlaid on a display screen 116 (916-918). Since the signals 121 are obtained from the same fixed locations within the predetermined area 220, alignment of the layered images is not required. By displaying and overlaying the images on the display screen 116, known points are aligned and can be visually observed in each of the layered aligned images. Based on these known aligned points the layered images can be analyzed in order to identify previously unknown fault locations or make measurements within the predetermined area (922).

Additionally, either layered or individual signal images may be correlated with design images 128 from the externally supplied data 114 (i.e., design data) that indicate the intended construction of the object (e.g., the chip, the die, the integrated circuit, the device, the material, etc.) and, particularly, the intended construction of the predetermined area of the object, in order to isolate faults or make measurements within the predetermined area. For example, known points in a signal image can be manually aligned with the same known points in the externally supplied design data image (920). Once these known points are aligned, the aligned images can be analyzed in order to identify the locations of other features (e.g., faults or other points of interest) and to make measurements within the predetermined area (922).

Therefore, disclosed above is a nanoscale physical fault isolation and measurement system that provides multiple near-field scanning physical fault isolation and measurement techniques on a common platform. Specifically, disclosed is a nanoscale physical fault isolation and measurement system that incorporates the use of a specialized carrier to hold an object, having electrical properties, and to supply electrical bias to a predetermined area of the object. The system further incorporates the use of a multi-probe assembly to evaluate the object. The multi-probe assembly comprises a plurality of arms mounted to a support structure about a common reference point. Each arm has a probe comprising an implement for a different type of physical fault isolation and measurement tool. The support structure and/or the arms are configured to move such that each probe can obtain measurements from the same fixed location. The support structure and/or the holder are configured such that their relative positioning can be changed in order to obtain measurements from multiple same fixed locations within the predetermined area of the object. Additionally, the system incorporates the use of a signal processor and another processor for analyzing the signals. Specifically, images associated with each signal are formed and precisely aligned with both design data and layered with other signal images in order to make measurements or isolate fault locations.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. A system for obtaining data from a predetermined area of an object having electrical properties, said system comprising:
    a holder holding said object, said holder comprising an insulating material and at least one conductor extending above said object from said insulating material, said at least one conductor electrically connected to multiple different conductive structures in said predetermined area of said object so that an electrical stimulus applied to said at least one conductor of said holder electrically biases said predetermined area; and
    a multi-probe assembly comprising:
        a common reference point; and
        a plurality of arms extending from said common reference point,
    wherein each of said arms comprise a probe with an implement adapted to evaluate said object by one of sensing a parameter and applying an energy source, and
    wherein one of said common attachment point and said plurality of arms is adapted to be moved so as to allow said implement from each one of said arms to evaluate said object at a same fixed location within said predetermined area.

2. The system of claim 1, wherein said multi-probe assembly is adapted to scan said predetermined area so as to allow said implement from each one of said arms to evaluate said object at a plurality of said same fixed locations within said predetermined area.

3. The system of claim 1, further comprising:
    a first processor in communication with said multi-probe assembly; and
    a second processor in communication with said first processor, wherein said first processor is adapted to receive signals from said implement from each one of said arms, to process said signals, and to transmit said signals after processing to said second processor.

4. The system of claim 3, wherein said second processor is adapted to form a plurality of images of said predetermined area based on said signals from said implement from each one of said arms, and
    wherein said second processor further comprises design data of said predetermined area and is adapted to precisely correlate said images with said design data.

5. The system of claim 4, wherein said images comprise nanometer-scale high-resolution images.

6. The system of claim 4, further comprising a display screen connected to said second processor, wherein said second processor is further adapted to allow a user to display said images on said display screen, to overlay said images, and to analyze said images in order to at least one of locate faults within said predetermined area and take measurements of said predetermined area.

7. The system of claim 1, wherein said object comprises one of a device, a material, an integrated circuit, a die and a chip.

8. The system of claim 1, wherein said different conductive structures comprise at least one of an internal circuit node, internal circuit device, and an internal circuit material in said predetermined area.

9. The system of claim 1, wherein said multi-probe assembly is adapted to scan said predetermined area so as to allow said implement from each one of said arms to evaluate said chip at a plurality of said same fixed locations within said predetermined area.

10. A system for obtaining data from a predetermined area of an object having electrical properties, said system comprising:
- a holder holding said object, said holder comprising an insulating material and at least one conductor extending above said object from said insulating material, said at least one conductor electrically connected to multiple different conductive structures in said predetermined area of said object so that an electrical stimulus applied to said at least one conductor of said holder electrically biases said predetermined area; and
- a multi-probe assembly comprising:
  - a common attachment point; and
  - a plurality of arms extending from said common attachment point, wherein each of said arms comprise a probe with a plurality of implements,
- wherein each of said implements is adapted to evaluate said object by one of sensing a parameter and applying an energy source, and
- wherein one of said common attachment point and said plurality of arms is adapted to be moved so as to allow each of said implements from each one of said arms to evaluate said object at a same fixed location within said predetermined area.

11. The system of claim 10, wherein said multi-probe assembly is adapted to scan said predetermined area so as to allow each of said implements from each one of said arms to evaluate said object at a plurality of said same fixed locations within said predetermined area.

12. The system of claim 10, further comprising:
- a first processor in communication with said multi-probe assembly; and
- a second processor in communication with said first processor, wherein said first processor is adapted to receive signals from each of said implements from each one of said arms, to process said signals, and to transmit said signals after processing to said second processor.

13. The system of claim 12, wherein said second processor is adapted to form, a plurality of images of said predetermined area based on said signals from each of said implements from each one of said arms, and
wherein said second processor further comprises design data of said predetermined area and is adapted to precisely correlate said images with said design data.

14. The system of claim 12, wherein said images comprise nanometer-scale high-resolution images.

15. The system of claim 12, further comprising a display screen connected to said second processor, wherein said second processor is further adapted to allow a user to display said images on said display screen, to overlay said images, and to analyze said images in order to at least one of locate faults within said predetermined area and take measurements of said predetermined area.

16. The system of claim 10, wherein said object comprises one of a device, a material, an integrated circuit, a die and a chip.

17. The system of claim 10, wherein said different conductive structures comprise at least one of an internal circuit node, an internal circuit device, and an internal circuit device material in said predetermined area.

18. A method of obtaining data from a predetermined area of an object having electrical properties, said method comprising:
- holding said object with a holder comprising insulating material such that said predetermined area of said object is exposed;
- electrically connecting multiple different conductive structures in said predetermined area to at least one conductor extending above said object from said insulating material of said holder;
- applying an electrical stimulus to said at least one conductor of said holder such that said electrical stimulus is conducted through said at least one conductor and said multiple different conductive structures in order to electrically bias said predetermined area; and
- evaluating said object from a same fixed location within said predetermined area by using a multi-probe assembly.

19. The method of claim 18, wherein said evaluating of said object comprises:
- providing said multi-probe assembly, said multi-probe assembly having a plurality of arms mounted at a common attachment point, wherein each of said arms extends from said common attachment point and comprises a probe with at least one implement, and wherein said implement of each one of said arms is adapted to evaluate said object by one of sensing a parameter and applying an energy source; and
- rotating one of said common attachment point and said plurality of arms so as to allow said implement of each one of said arms to evaluate said object from said same fixed location within said predetermined area.

20. The method of claim 19, further comprising scanning said predetermined area so as to allow said implement of each one of said arms to evaluate said object at a plurality of said same fixed locations within said predetermined area.

21. The method of claim 19, further comprising:
- receiving signals from said implement of each one of said arms; and
- processing said signals in order to provide a plurality of images of said predetermined area based on said signals.

22. The method of claim 21, further comprising correlating said images to design data for said predetermined area in order to isolate faults within said predetermined area.

23. The method of claim 21, wherein said providing of said images further comprises providing nanometer-scale high-resolution images.

24. The method of claim 21, further comprising displaying said images on a display screen, overlaying said images, and analyzing said images in order to at least one of identify fault locations within said predetermined area and make measurements within said predetermined area.

25. A system for obtaining data, said system comprising:
- a holder holding a chip, said holder comprising an insulating material and at least one conductor extending above said chip from said insulating material, said at least one conductor electrically connected to multiple different conductive structures in said predetermined area of said chip so that an electrical stimulus applied to said at least one conductor of said holder electrically biases said predetermined area; and
- a multi-probe assembly comprising:
  - a common reference point; and
  - a plurality of arms extending from said common reference point,
- wherein each of said arms comprise a probe with at least one implement adapted to evaluate said chip by applying an energy source, and
- wherein one of said common attachment point and said plurality of arms is adapted to be moved so as to allow said at least one implement to evaluate said chip at a same fixed location within said predetermined area.

26. The system of claim 25, further comprising:
a first processor in communication with said multi-probe assembly; and
a second processor in communication with said first processor, wherein said first processor is adapted to receive signals from said implement from each one of said arms, to process said signals, and to transmit said signals after processing to said second processor.

27. The system of claim 26, wherein said second processor is adapted to form a plurality of images of said predetermined area based on said signals from said implement from each one of said arms, and wherein said second processor further comprises design data of said predetermined area and is adapted to precisely correlate said images with said design data.

28. The system of claim 27, wherein said images comprise nanometer-scale high-resolution images.

29. The system of claim 27, further comprising a display screen connected to said second processor, wherein said second processor is further adapted to allow a user to display said images on said display screen, to overlay said images, and to analyze said images in order to at least one of locate faults within said predetermined area and take measurements of said predetermined area.

* * * * *